(12) United States Patent
Okutani et al.

(10) Patent No.: US 8,513,656 B2
(45) Date of Patent: Aug. 20, 2013

(54) ORGANIC EL DEVICE AND METHOD FOR MANUFACTURING THE SAME

(75) Inventors: Satoshi Okutani, Ishikawa-Gun (JP); Norihisa Maeda, Ishikawa-Gun (JP); Masashi Takahashi, Ishikawa-Gun (JP); Takeshi Ikeda, Hakusan (JP); Masuyuki Oota, Hakusan (JP)

(73) Assignee: Japan Display Central Inc., Fukaya-shi (JP)

( * ) Notice: Subject to any disclaimer, the term of this patent is extended or adjusted under 35 U.S.C. 154(b) by 222 days.

(21) Appl. No.: 13/017,581

(22) Filed: Jan. 31, 2011

(65) Prior Publication Data
US 2011/0233576 A1    Sep. 29, 2011

(30) Foreign Application Priority Data
Mar. 24, 2010 (JP) .................................. 2010-68030

(51) Int. Cl.
*H01L 29/08* (2006.01)
(52) U.S. Cl.
USPC .................. 257/40; 257/59; 257/72; 257/258
(58) Field of Classification Search
USPC ........................................ 257/40, 59, 72, 258
See application file for complete search history.

(56) References Cited

U.S. PATENT DOCUMENTS

| 4,720,432 | A | 1/1988 | VanSlyke et al. |
| 6,353,257 | B1 | 3/2002 | Huang |
| 2007/0108893 | A1 | 5/2007 | Lee et al. |
| 2008/0018239 | A1 | 1/2008 | Matsuda et al. |
| 2010/0044690 | A1 | 2/2010 | Okutani et al. |
| 2010/0283385 | A1 | 11/2010 | Maeda et al. |
| 2010/0295027 | A1* | 11/2010 | Kawamura et al. .............. 257/40 |

FOREIGN PATENT DOCUMENTS

| CN | 1717959 A | 1/2006 |
| JP | 2597377 | 1/1997 |
| JP | 2000-208254 | 7/2000 |

(Continued)

OTHER PUBLICATIONS

Office Action issued on Feb. 7, 2012 in the corresponding Japanese Patent Application No. 2010-068030 (with English Translation).
U.S. Appl. No. 13/047,240, filed Mar. 14, 2011, Ikeda.
Office Action issued Mar. 9, 2011, in Korean Patent Application No. 10-2009-0077029.
Combined Chinese Office Action and Search Report issued Dec. 20, 2012, in Chinese Patent Application No. 201110052228.1 with English translation.

*Primary Examiner* — Tan N Tran
(74) *Attorney, Agent, or Firm* — Oblon, Spivak, McClelland, Maier & Neustadt, L.L.P.

(57) ABSTRACT

According to one embodiment, an organic EL device includes a first organic EL element, a second organic EL element and a third organic EL element. The first organic EL element has a first electrode, a second electrode, and a first emitting layer. The second organic EL element has a third electrode, a fourth electrode, and a second emitting layer. At least a part of the first emitting layer extends on the second emitting layer. A third organic EL element has a fifth electrode, a sixth electrode, and a third emitting layer. At least a part of the first and the second emitting layers extends on the third emitting layer. A thickness of the first emitting layer between the first and the second electrodes is thicker than a thickness of the first emitting layer extending on the second and the third emitting layers.

13 Claims, 7 Drawing Sheets

(56) References Cited

FOREIGN PATENT DOCUMENTS

| | | |
|---|---|---|
| JP | 2005-174940 A | 6/2005 |
| JP | 2005-209421 | 8/2005 |
| JP | 2007-299729 | 11/2007 |
| JP | 2008-27722 | 2/2008 |
| JP | 2010-153116 | 7/2010 |
| JP | 2010-182422 | 8/2010 |
| KR | 10-2007-0087773 | 8/2007 |
| KR | 10-2008-0008983 | 1/2008 |

* cited by examiner

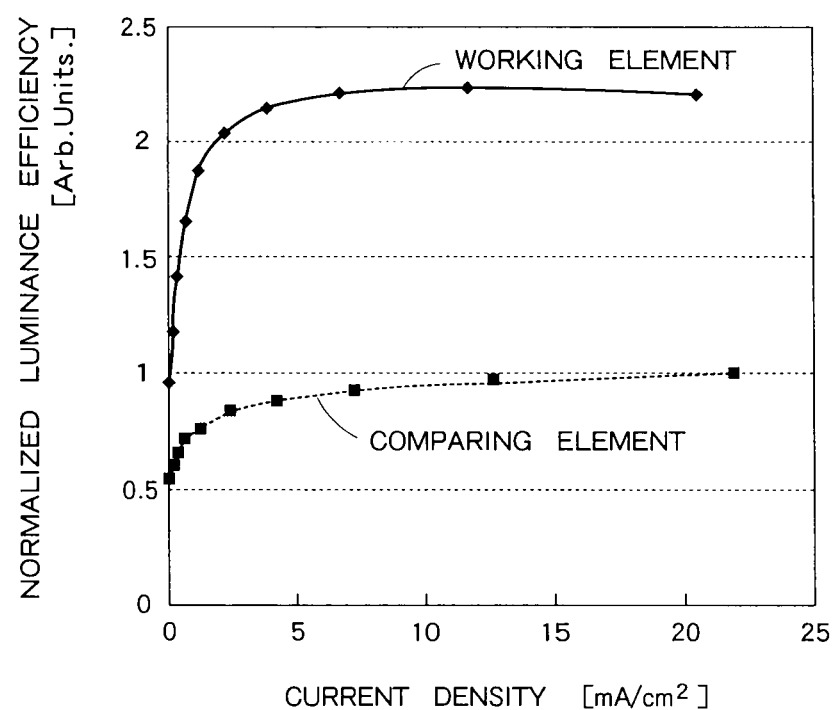
F I G. 3

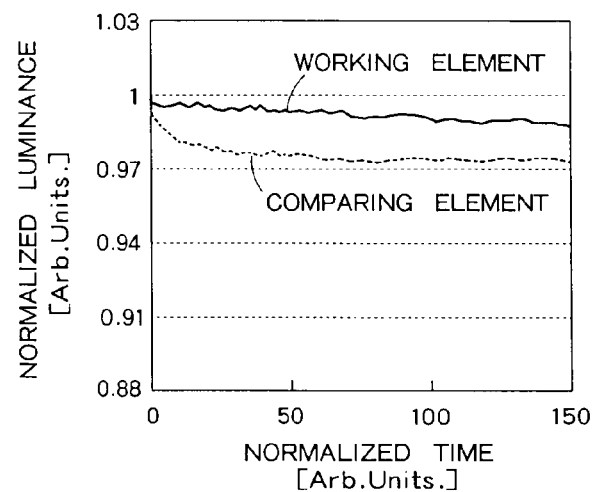
F I G. 4A
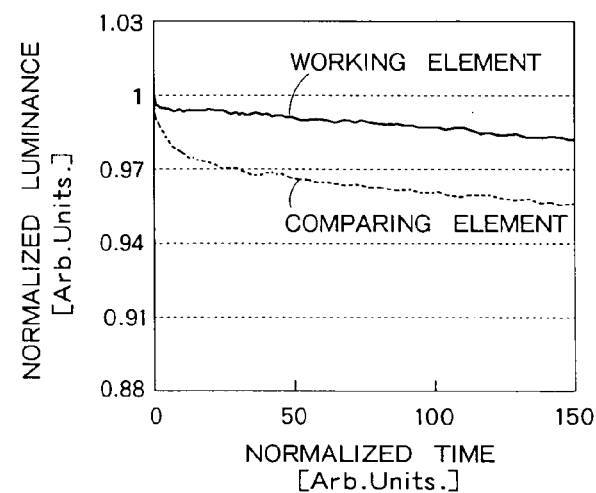
F I G. 4B
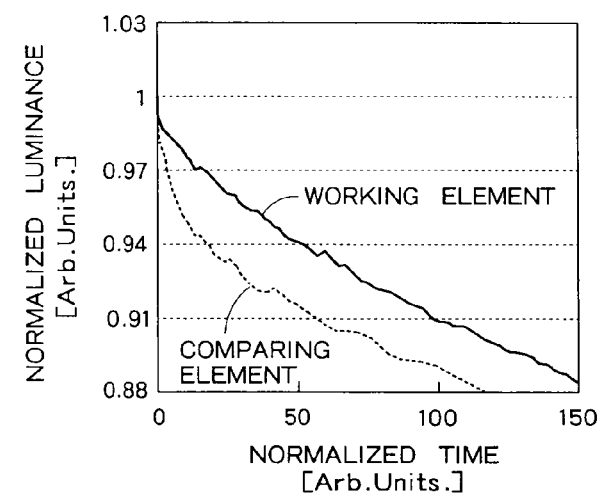
F I G. 4C

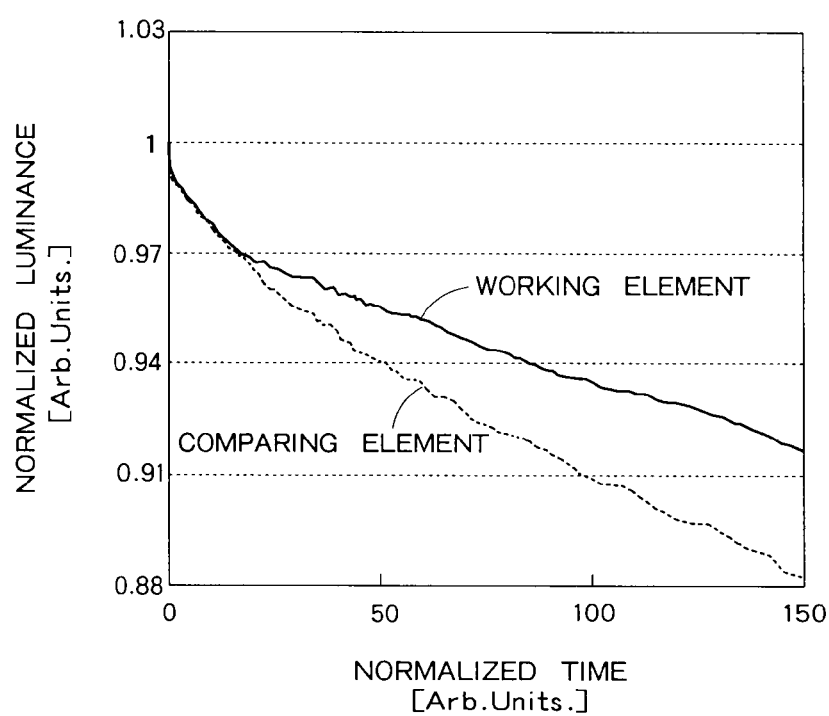
F I G. 5

ORGANIC EL DEVICE AND METHOD FOR MANUFACTURING THE SAME

CROSS REFERENCE TO RELATED APPLICATIONS

This application is based upon and claims the benefit of priority from the prior Japanese Patent Application No. 2010-68030, filed on Mar. 24, 2010, the entire contents of which are incorporated herein by reference.

FIELD

Embodiments described herein relate generally to an organic EL device and method for manufacturing the same.

BACKGROUND

An organic EL display has an organic EL element, which is a self-luminous element, and has features, such as a wide view angle, reduced thickness of the display due to an unnecessity of a backlight, a fast response, and so on. Therefore, the organic EL display attracts attention as a display for future generation.

In general, the organic EL element has a structure where a hole injection layer, a hole transport layer, an emitting layer, an electron transport layer and an electron injection layer are stacked between an anode and a cathode (for example, JP2597377B2). However, a luminance efficiency of the organic EL element having the structure described above is not high enough, which cause a high driving voltage. Furthermore, there is a problem that if holes injected from the anode leaks to the electron transport layer through the emitting layer, the electron transport layer may deteriorate and the lifetime of the organic EL element may become short.

BRIEF DESCRIPTION OF THE DRAWINGS

FIG. 3 is a graph showing a luminance efficiency of the organic EL element 50r.

FIGS. 4A to 4C are graphs showing the variations of the luminance of the organic EL elements 50r, 50g and 50b respectively, by comparing a presence of the hole blocking layer with an absence thereof.

FIG. 5 is a graph showing a time variation of the luminance of the organic EL element 50b, by changing a film thickness of the blue emitting layer.

DETAILED DESCRIPTION

In general, according to one embodiment, an organic EL device includes a first organic EL element, a second organic EL element and a third organic EL element. The first organic EL element is configured to have a first electrode on a substrate, a second electrode facing the first electrode, and a first emitting layer capable of emitting a first-colored light between the first and the second electrodes. The second organic EL element is configured to have a third electrode on the substrate, a fourth electrode facing the third electrode, and a second emitting layer capable of emitting a second-colored light having a center wavelength longer than a center wavelength of the first-colored light between the third and the fourth electrodes. At least a part of the first emitting layer extends on the second emitting layer. A third organic EL element is configured to have a fifth electrode on the substrate, a sixth electrode facing the fifth electrode, and a third emitting layer capable of emitting a third-colored light having a center wavelength longer than the center wavelength of the second-colored light between the fifth and the sixth electrodes. At least a part of the first and the second emitting layers extends on the third emitting layer. A thickness of the first emitting layer between the first and the second electrodes is thicker than a thickness of the first emitting layer extending on the second and the third emitting layers.

Embodiments will now be explained with reference to the accompanying drawings.

First Embodiment

Figure 1:
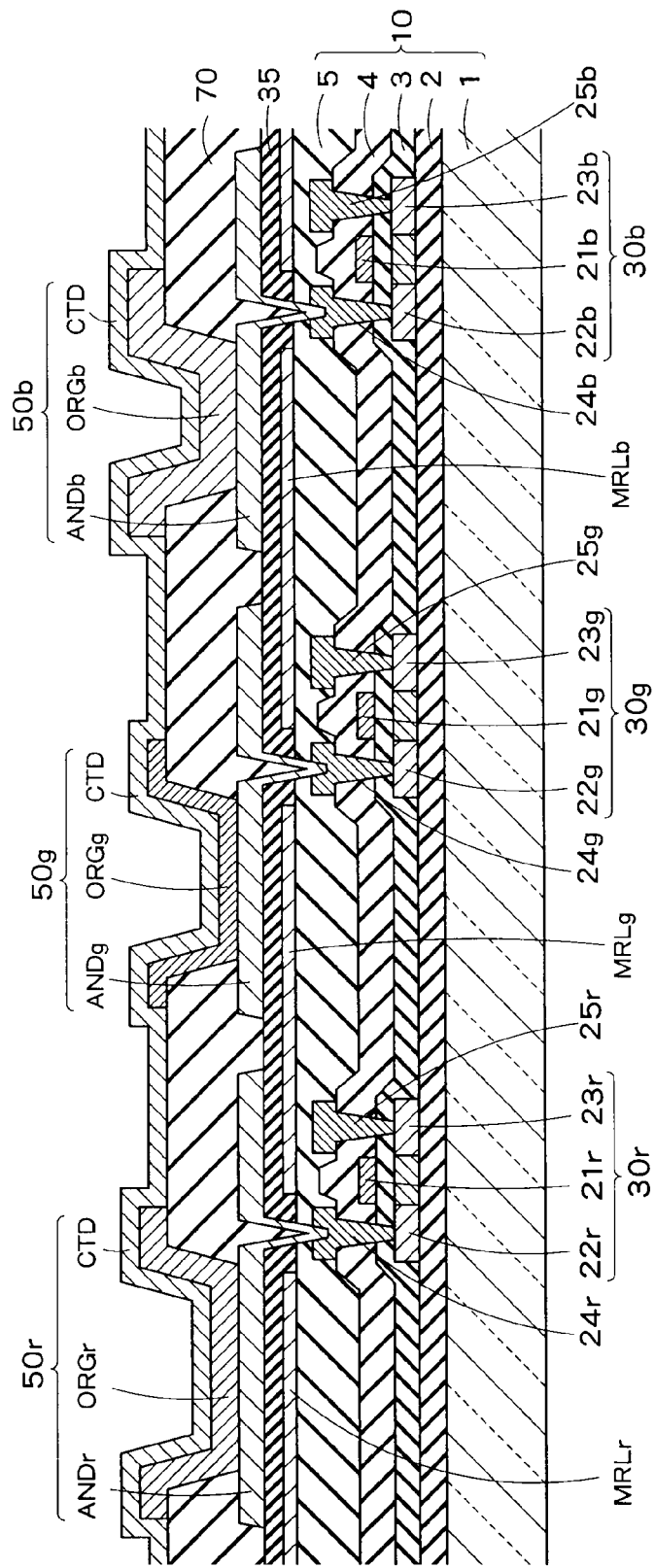
FIG. 1 is a cross-section of a pixel of an organic EL display according to one embodiment.

FIG. 1 is a cross-section of a pixel of an organic EL display according to one embodiment. The organic EL display has a wiring substrate 10, thin film transistors (hereinafter, referred to as TFTs) 30r, 30g and 30b, metal reflecting layers MRLr, MRLg and MRLb, an organic insulating layer 35, organic EL elements 50r, 50g and 50b, and a dividing wall 70. FIG. 1 shows an example of a structure of a top-face-emitting-element which emits light from the top face of the organic EL display.

The wiring substrate 10 has a glass substrate 1, an undercoat layer 2, a gate insulating film 3, an interlayer insulating film 4, and an organic insulating layer 5. The undercoat layer 2 on the glass substrate 1 is made of $SiN_x$ or $SiO_x$, for example. On the undercoat layer 2, the TFTs 30r, 30g and 30b, selecting elements, pixel capacitances and various wirings such as video signal lines (not shown) are formed.

The TFT 30r has the gate insulating film 3, a drain region 22r and a source region 23r formed on a semiconductor region. A drain electrode 24 of the TFT 30r is connected to an anode ANDr of the organic EL element 50r to generate a current depending on a video signal voltage therethrough. Each of the structures of the TFT 30g and 30b is similar to that of the TFT 50r. Each of the TFTs 30r, 30g and 30b is covered with the interlayer insulating film 4 and the organic insulating layer 5 and separated from other elements. The interlayer insulting film 4 is made of the $SiO_2$ and the organic insulating layer 5 is made of resin material, for example.

The metal reflecting layers MRLr, MRLg and MRLb are formed on the organic insulating layer 5, and reflect the light emitted by the organic EL elements 50r, 50g and 50b to the lower surface toward the upper surface. Metal reflecting layers MRLr, MRLg and MRLb are insulated by the organic insulating layer 35 from each other.

The organic EL elements 50r, 50g and 50b are separately formed on the glass substrate 1. The organic EL element 50r has the anode ANDr, an organic layer ORGr and a cathode CTD. The anode ANDr, made of ITO (Indium Tin Oxide), for example, is formed on the metal reflecting layer MRLr, and is an optically-transparent electrode. The organic layer ORGr emits the light whose brightness depends on the current generated by the TFT 30r. The cathode CTD is a translucent electrode made of 95% of magnesium and 5% of silver.

The organic EL element 50b has an emitting layer capable of emitting blue (first emitting color) light. The organic EL element 50g has an emitting layer capable of emitting green (second emitting color) light whose center wavelength is longer than that of the blue light. The organic EL element 50r has an emitting layer capable of emitting red (third emitting color) light whose center wavelength is longer than that of the green light. Furthermore, the structures of the organic layers ORGr, ORGg and ORGb differ, which will be described below. Except these points, the structures of the organic EL elements 50r, 50g and 50b are similar. Additionally, FIG. 1 shows an example where the cathode CTD is commonly used among the organic EL elements 50r, 50g and 50b.

The dividing wall 70 electrically separates the neighboring organic EL elements 50r, 50g and 50b and is made of resin materials, for example.

FIG. 1 shows a cross-section of one pixel, and by arranging a plurality of pixels in matrix-shape, the organic EL display having diagonal lines of "10" inch is implemented, for example.

Figure 2C:
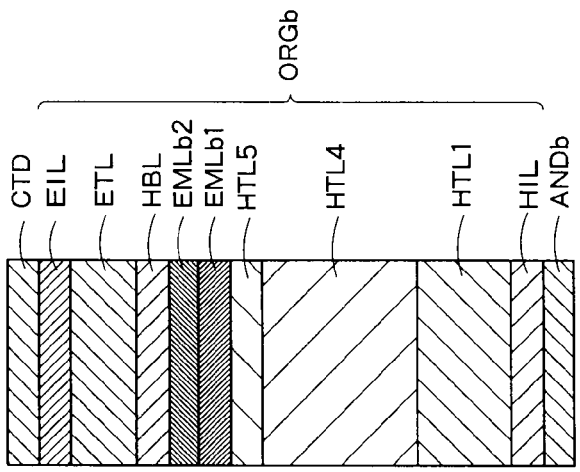
FIGS. 2A to 2C are cross-sections of the organic EL elements 50r, 50g and 50b, respectively.
Figure 2B:
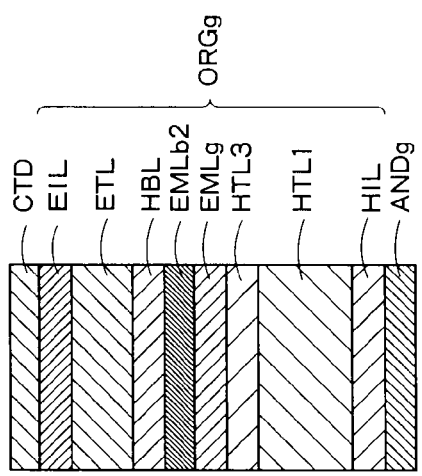
Figure 2A:
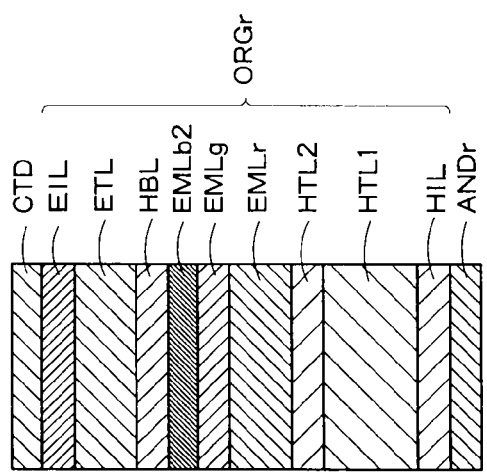

FIGS. 2A to 2C are cross-sections of the organic EL elements 50r, 50g and 50b, respectively. The organic EL elements 50r, 50g and 50b are formed on the metal reflecting layers MRLr, MRLg and MRLb, respectively.

The organic EL element 50r, which emits red light (third organic EL element), has the anode ANDr, a hole injection layer HIL, a first hole transport layer HTL1, a second hole transport layer HTL2, a red emitting layer EMLr, a green emitting layer EMLg, a sub blue emitting layer EMLb2, a hole blocking layer HBL, an electron transport layer ETL, an electron injection layer EIL, and the cathode CTD. The green emitting layer EMLg and the sub blue emitting layer EMLb2 on the red emitting layer EMLr extend from parts of the emitting layer of the organic EL element 50g and 50b. A part except the anode ANDr and the cathode CTD is an organic layer ORGr. The thickness from the top face of the metal reflecting layer MRLr to the bottom face of the cathode CTD is 126.5 nm, for example.

The organic EL element 50g, which emits green light (second organic EL element), has an anode ANDg, the hole injection layer HIL, the first hole transport layer HTL1, a third hole transport layer HTL3, the green emitting layer EMLg, the sub blue emitting layer EMLb2, the hole blocking layer HBL, the electron transport layer ETL, the electron injection layer EIL, and the cathode CTD. The sub blue emitting layer EMLb2 on the green emitting layer EMLg extends from a part of the organic EL element 50b. A part except the anode ANDg and the cathode CTD is an organic layer ORGg. The thickness from the top face of the metal reflecting layer MRLg to the bottom face of the cathode CTD is 102.5 nm, for example.

The organic EL element 50b, which emits blue light (third organic EL element), has an anode ANDb, the hole injection layer HIL, the first hole transport layer HTL1, a fourth hole transport layer HTL4, a fifth hole transport layer HTL5, the green emitting layer EMLg, a main blue emitting layer EMLb1, the sub blue emitting layer EMLb2, the hole blocking layer HBL, the electron transport layer ETL, the electron injection layer EIL, and the cathode CTD. A part except the anode ANDb and the cathode CTD is an organic layer ORGb. The thickness from the top face of the metal reflecting layer MRLb to the bottom face of the cathode CTD is 199.5 nm, for example. Note that, the material of the main blue emitting layer EMLb1 may be identical to or different from that of the sub blue emitting layer EMLb2.

The material of the hole injection layer HIL is one whose injection efficiency of holes from the anode AND is high and is, for example, an amorphous carbon. Furthermore, comparing to forming the first hole transport layer HTL1 directly on the anode AND, the interface characteristic improves by providing the hole injection layer HIL. The first to fifth hole transport layers HTL1 to HTL5 transport holes to the emitting layers. The second to fifth hole transport layers HTL2 to HTL5 are also used in order to control the thickness of the organic EL elements 50r, 50g and 50b to be the above values, respectively.

The materials of the first to the fifth hole transport layers HTL1 to HTL5 may be identical and may be different. When using different materials, low-cost materials may be used for the thick hole transport layers, and materials compatible to the red emitting layer EMLr, the green emitting layer EMLg, and the main and sub blue emitting layers EMLb1 and EMLb2 may be used for hole transport layers formed just under each of the emitting layers.

Each emitting layer has a host and a few percent of dopants doped in the host. When current flows in the emitting layer, the dopants receive energy from the host and emit red (third-colored) light, green (second-colored) light and blue (first-colored) light, respectively according to the kind of the dopants.

The hole blocking layer HBL keeps the holes (carrier) injected from the anode in the emitting layer to prevent the holes from leaking to the electron transport layer ETL. The electron injection layer EIL injects electrons from the cathode CTD. The electron transport layer ETL transports the injected electrons to the emitting layer.

In the present embodiment, one of the characteristic feature is that the sub blue emitting layer EMLb2 is formed on the red emitting layer EMLr of the organic EL element 50r, the sub blue emitting layer EMLb2 is formed on the green emitting layer EMLg of the organic EL element 50g, and further, the total thickness of the main and sub blue emitting layers EMLb1 and EMLb2 of the organic EL element 50b is thicker than that of the sub blue emitting layer EMLb2 of the organic EL elements 50r and 50g. By such a structure, an emitting efficiency of the organic EL element 50r improves, and luminance degradation of the organic EL element 50b can be suppressed.

Furthermore, identical materials are used for the hole transport layer HTL1, the sub blue emitting layer EMLb2 and the layers thereon of the organic EL elements 50r, 50g and 50b, and the green emitting layer EMLg of the organic EL elements 50r and 50g, respectively. Therefore, a utilization efficiency of the materials improves, thereby suppressing the manufacturing cost.

The organic EL element 50r operates as below. When a voltage is applied between the anode ANDr and the cathode CTD, the holes are injected from the hole injection layer HIL and the electrons are injected from the electron injection layer EIL into the red emitting layer EMLr, the green emitting layer EMLg and the sub blue emitting layer EMLb2. Then, the holes and the electrons recombine in these emitting layers to generate exciton. When the exciton returns to ground state, the light whose wavelength depends on the kind of the dopants is emitted.

The emitting layers emit the light hardly to the lateral direction of FIG. 2A but mainly to the upper or downward direction. A part of the light emitted by the emitting layer to the upper direction is transmissive to the cathode CTD to be taken out to outside. The other light is reflected at the cathode CTD to head for the downward direction. The light to the downward direction is reflected at the metal reflecting layer MRLr formed under the optically-transparent ANDr to head for the upper direction. By reflecting the light between the cathode CTD and the metal reflecting layer MRLr, only a resonant wavelength among the light emitted by the emitting layer is amplified. As a result, the light whose peak intensity is high and having a narrow spectrum can be taken out, thereby widening a color reproduction range (microcavity effect).

The operations of the organic EL elements 50g and 50b are similar to that of the organic EL element 50r.

The organic EL display having the organic EL elements 50r, 50g and 50b is manufactured as below. Firstly, the hole injection layer HIL and the first hole transport layer HTL1 common to the organic EL elements 50r, 50g and 50b are formed on the anodes ANDr, ANDg and ANDb. Secondly, the second hole transport layer HTL2 is formed on the first hole transport layer HTL1 corresponding to the anode ANDr, the third hole transport layer HTL3 is formed on the hole transport layer HTL1 corresponding to the anode ANDg, and the fourth and fifth hole transport layers HTL4 and HTL5 are formed on the first hole transport layer HTL1 corresponding to the ANDb.

Then, the red emitting layer EMLr is formed on the second hole transport layer HTL2. Furthermore, the green emitting layer EMLg is formed on the red emitting layer EMLr and the third hole transport layer HTL3. Then, before or after forming the red emitting layer EMLr or after forming the green emitting layer EMLg, the main blue emitting layer EMLb1 is formed on the fifth hole transport layer HTL5. After that, the sub blue emitting layer EMLb2 common to the organic EL elements 50r, 50g and 50b is formed on the green emitting layer EMLg and the main blue emitting layer EMLb1.

Then, the hole blocking layer HBL, the electron transport layer ETL and the electron injection layer EIL are formed on the sub blue emitting layer EMLb2, in sequence.

By manufacturing like this, the thickness of the green emitting layer EMLg of the organic EL element 50r is the same as that of the organic EL element 50g. Furthermore, thicknesses of the sub blue emitting layer EMLb2 and each layer thereon are also the same because these are formed commonly at the same time. By forming these layers in common, the manufacturing cost can be suppressed.

Note that, when the material of the main blue emitting layer EMLb1 is the same as that of the sub blue emitting layer EMLb2, forming the main blue emitting layer EMLb1 can be omitted, and instead, the sub blue emitting layer EMLb2 only of the organic EL element 50b can be formed thickly.

Now, characteristics of the organic EL elements 50r, 50g and 50b will be explained.

FIG. 3 is a graph showing a luminance efficiency of the organic EL element 50r. The horizontal axis shows a current density, and the vertical axis shows a normalized luminance efficiency. "Working element" of the FIG. 3 is the organic EL element 50r of FIG. 2A, and "Comparing element" of the FIG. 3 is an organic EL element 50r of FIG. 2A without the dopants in the green emitting layer EMLg and the sub blue emitting layer EMLb2.

The graph of FIG. 3 is obtained by the following manner. Firstly, a current is generated in the organic EL element to measure the current by an ampere meter. The value obtained by dividing the current by an area of the organic EL element is set to be the current density. Meanwhile, the luminance of the light emitted by the organic EL element is measured by a luminance meter, and the value obtained by dividing the luminance by the current density is set to be the luminance efficiency. After measuring the luminance efficiency at each current density, the value obtained by normalizing the luminance efficiency by the maximum luminance efficiency of the comparing element is set to the normalized luminance efficiency.

As seen from FIG. 3, by doping the dopants in the green emitting layer EMLg and the sub blue emitting layer EMLb2, the luminance efficiency improves by about "2.2" times. Because the luminance efficiency improves, the driving voltage can be decreased.

It is considered that the reason to improve the luminance efficiency is that the green emitting layer EMLg and the sub blue emitting layer EMLb2 prevent the holes injected to the red emitting layer EMLr from leaking into the electron transport layer ETL. Because energy of green and blue is higher than that of red, bandgaps of the green emitting layer EMLg and the sub blue emitting layer EMLb2 are larger than that of the red emitting layer EMLr. Therefore, a large part of the holes injected to the hole injection layer HIL, the first and second hole transport layers HTL1 and HTL2 cannot move to the green emitting layer EMLg and stays in the red emitting layer EMLr. As a result, the recombination between the holes and the electrons occurs efficiently, thereby improving the luminance efficient.

It is also considered that another reason is that a light-disappearance by locally accumulated electrons at the interfaces between the emitting layers can be suppressed. In a case of the comparing element, the electrons are accumulated at the interface between the red emitting layer EMLr and the green emitting layer EMLg because the dopants are not doped in the green emitting layer EMLg. If the accumulated electrons interact with the exciton generated in the red emitting layer EMLr, the light may disappear. On the other hand, in a case of the working element of the organic EL element 50r, because formed are the green emitting layer EMLg and the sub blue emitting layer EMLb2 in which the dopants are doped, the electrons are accumulated at the interface between the green emitting layer EMLg and the sub blue emitting layer EMLb2. However, since the interface between the green emitting layer EMLg and the sub blue emitting layer EMLb2 is far from the red emitting layer EMLr, the interaction between the exciton and the accumulated electrons is small. Therefore, the light-disappearance is suppressed and the luminance efficiency improves.

Furthermore, as stated above, because the holes stay in the red emitting layer EMLr, mainly the red emitting layer EMLr emits light, and the green emitting layer EMLg and the sub blue emitting layer EMLb2 emit the light a little. However, the green light emitted by the green emitting layer EMLg and the blue light emitted by the sub blue emitting layer EMLb2 are converted to the red light having lower energy (color-conversion effect), and luminance efficiency of the red light further improves.

As mentioned above, by forming the green emitting layer EMLg and the sub blue emitting layer EMLb2 on the red emitting layer EMLr of the organic EL element 50r, the luminance efficiency of the red light improves, and the driving voltage can be decreased.

FIGS. 4A to 4C are graphs showing time variations of the luminance of the organic EL elements 50r, 50g and 50b respectively, by comparing a presence of the hole blocking layer HBL with an absence thereof. The horizontal axis shows an arbitrarily-normalized time, and the vertical axis shows the luminance normalized by an initial luminance. FIGS. 4A to 4C show normalized luminances of the organic EL elements 50rm 50g and 50b, respectively. In order to remove an influence of the sub blue emitting layer EMLb2 and examine a difference of a lifetime according to the presence/absence of the hole blocking layer HBL, the "Working elements" of FIGS. 4A to 4C are organic EL elements 50r, 50g and 50b of FIGS. 2A to 2C without the sub blue emitting layer EMLb2, respectively. Here, instead of not forming the sub blue emitting layer EMLb2, the electron transport layer ETL is formed thickly to set the total thicknesses of the working elements become the same as the organic EL elements 50r, 50g and 50b of FIGS. 2A to 2C, respectively. On the other hand, the "Comparing element" is an organic EL element of the working element without the hole blocking layer HBL.

The graphs of FIGS. 4A to 4C are obtained by normalizing a luminance measured by the luminance meter at each time by the luminance at time "0" while generating constant current in the organic EL element. Note that, because the graphs of FIGS. 4A to 4C are obtained by an accelerated test, the time shown in horizontal axis is also normalized.

As seen from FIGS. 4A to 4C, comparing to the comparing element, the luminance degradations at the beginning of power distribution of the working elements are suppressed. If there is no hole blocking layer HBL, the electron transport layer ETL deteriorates due to the holes leaking from the emitting layer to the electron transport layer ETL, and the luminance decreases drastically at the beginning of the power distribution. On the other hand, because the working elements have the hole blocking layer HBL, the number of the holes leaking into the electron transport layer ETL decreases, thereby suppressing the luminance degradation at the beginning of power distribution. As a result, the lifetimes of organic EL elements 50r, 50g and 50b become long.

As mentioned above, by forming the hole blocking layer HBL, the luminance degradation at the beginning of the power distribution can be suppressed. Note that, the hole blocking layer HBL is not an indispensable component. If the luminance degradation does not become a problem and so on, the hole blocking layer HBL can be omitted.

After the beginning of the power distribution, at normalized time "25" of FIGS. 4A to 4C, for example, the luminance degradations hardly depends on the presence/absence of the hole blocking layer HBL. In particular, although the luminance degradation of the organic EL elements 50r and 50g are only a few percent, that of the organic EL element 50b exceeds "10" percent even if the organic EL element 50b has the hole blocking layer HBL. Therefore, the luminance degradation at a later stage of the power distribution is not improved enough.

FIG. 5 is a graph showing a time variation of the luminance of the organic EL element 50b, by changing a film thickness of the blue emitting layer. The horizontal and vertical axes are similar to those of FIGS. 4A to 4C, and the graph of FIG. 5 is obtained by similar manner of FIGS. 4A to 4C. The "Working element" of FIG. 5 is the organic EL element 50b of FIG. 2C. The "Comparing element" of FIG. 5 is the same as the comparing element of FIG. 4C, which is the organic EL element 50b without the sub blue emitting layer EMLb2 and with the thick electron transport layer ETL to have a total thickness same as that of the FIG. 2C. That is, the film thickness of the main and sub blue emitting layers EMLb1 and EMLb2 of the working element is thicker than that of the main blue emitting layer EMLb1 of the comparing element.

As seen from FIG. 5, by forming the main and sub blue emitting layers EMLb1 and EMLb2 of the organic EL element 50b thickly, the luminance degradation at the later stage of the power distribution (for example, after the normalized time "25") can be suppressed.

As stated above, in the present embodiment, because forming the green emitting layer EMLg and the sub blue emitting layer EMLb2 on the red emitting layer EMLr of the organic EL element 50r, the luminance efficiency of the red light improves. Furthermore, because the emitting layer of the organic EL element 50b is formed thickly, the luminance degradation at the later stage of the power distribution can be suppressed. Additionally, by forming the hole blocking layer HBL common to the organic EL elements 50r, 50g and 50b, the luminance degradation at the beginning of the power distribution can be suppressed. As a result, the driving voltage can be lowered and the lifetimes of the organic EL elements 50r, 50g and 50b become long. Furthermore, the sub blue emitting layer EMLb2 and each layer thereon are used common to the organic EL elements 50r, 50g and 50b. Therefore, the manufacturing cost can be decrease.

Note that the film thickness of the hole transport layer and so on may be adjusted so that the thickness is suitable for the light emitted by the organic EL elements 50r, 50g and 50b to resonate between the metal reflecting layer and the cathode. The thickness can be calculated based on the wavelength to be taken out, the refractive index of each layer and so on. The microcavity effect can be examined experimentally using the calculated thickness. More specifically, the thickness of the organic EL element 50r is set to be 110 nm to 130 nm, that of the organic EL element 50g is set to be 85 nm to 105 nm, and that of the organic EL element 50b is set to be 182 nm to 202 nm, regardless of the materials of each layer.

Figure 6A:
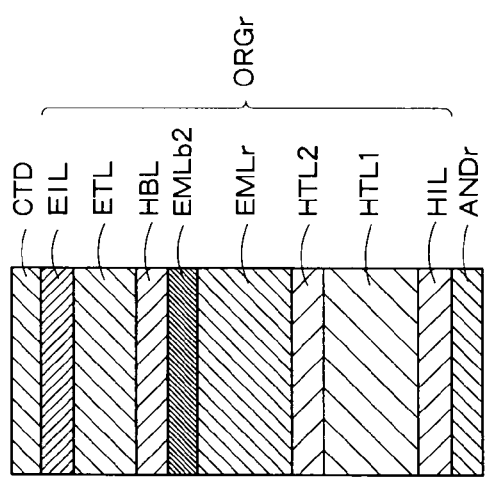
FIGS. 6A to 6C are modified examples of the organic EL elements 50r, 50g and 50b, respectively.
Figure 6B:
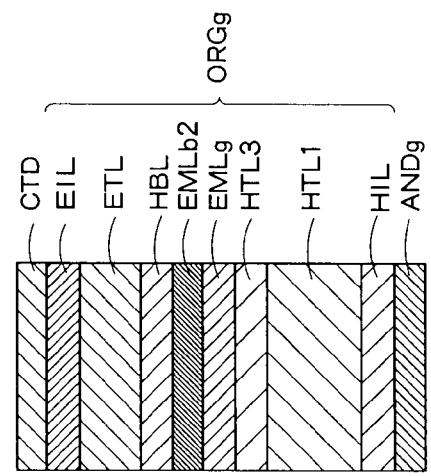
Figure 6C:
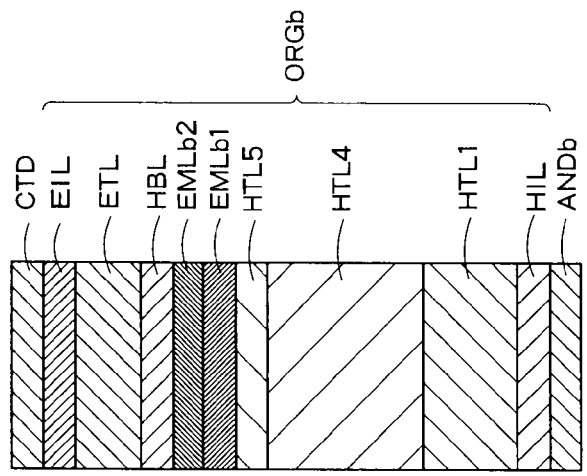

FIGS. 6A to 6C are modified examples of the organic EL elements 50r, 50g and 50b, respectively. In FIG. 6A, the red emitting layer EMLr is formed thickly instead of not forming the green emitting layer EMLg for the organic EL element 50r of FIG. 2A. The structures of FIGS. 6B and 6C are the same as those of FIGS. 2B and 2C, respectively.

Figure 7C:
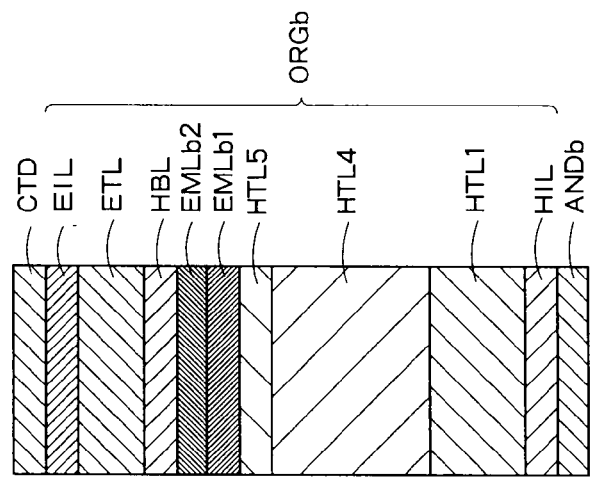
FIGS. 7A to 7C are other modified examples of the organic EL elements 50r, 50g and 50b, respectively.
Figure 7B:
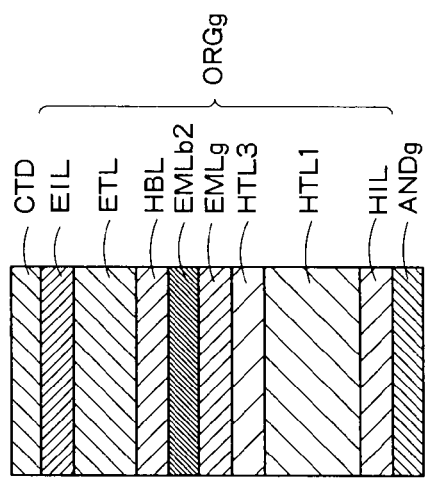
Figure 7A:
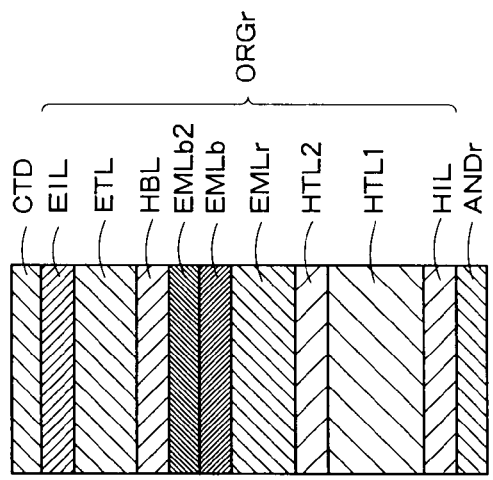

FIGS. 7A to 7C are other modified examples of the organic EL elements 50r, 50g and 50b, respectively. In FIG. 7A, a blue emitting layer EMLb is formed instead of not forming the green emitting layer EMLg for the organic EL element 50r of FIG. 2A. The material of the blue emitting layer EMLb may be identical to or may be different from one of the material of the main and sub blue emitting layers EMLb1 and EMLb2. By setting the material and the film thickness of the blue emitting layer EMLb identical to those of the sub blue emitting layer EMLb2, the blue emitting layer EMLb and the sub blue emitting layer EMLb2 can be formed at the same time, and the manufacturing process can be simplified. The structures of FIGS. 7B and 7C are the same as those of FIGS. 2B and 2C, respectively.

Similar to the organic EL element 50 of FIGS. 2A to 2C, the luminance efficient of the red light improves because the red emitting layer EMLr formed thickly and the sub blue emitting layers EMLb and EMLb2 (FIG. 6A) or the sub blue emitting layer EMLb2 (FIG. 7A) suppress the light-disappearance by locally accumulated electrons at the interfaces between the emitting layers and prevent the holes from leaking to the electron transport layer ETL.

The present embodiment shows an example where the cathode CTD is common to the organic EL elements 50r, 50g and 50b. However, the cathode CTD is provided separately corresponding to each organic EL element.

Furthermore, the organic EL elements can be used as a light source of a printer head or a lighting device.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and spirit of the inventions.

The invention claimed is:
1. An organic EL device comprising:
a first organic EL element configured to comprise a first electrode on a substrate, a second electrode facing the first electrode, and a first emitting layer capable of emitting a first-colored light between the first and the second electrodes;

a second organic EL element configured to comprise a third electrode on the substrate, a fourth electrode facing the third electrode, and a second emitting layer capable of emitting a second-colored light having a center wavelength longer than a center wavelength of the first-colored light between the third and the fourth electrodes, wherein at least a part of the first emitting layer extends on the second emitting layer; and a third organic EL element configured to comprise a fifth electrode on the substrate, a sixth electrode facing the fifth electrode, and a third emitting layer capable of emitting a third-colored light having a center wavelength longer than the center wavelength of the second-colored light between the fifth and the sixth electrodes, wherein at least a part of the first emitting layer and a part of the second emitting layers extend on the third emitting layer;

wherein a thickness of the first emitting layer between the first and the second electrodes is thicker than a thickness of the first emitting layer extending on the second and the third emitting layers.

2. The device of claim 1, wherein the first organic EL element further comprises a first carrier blocking layer on the first emitting layer configured to keep a carrier injected from the first electrode in the first emitting layer, the second organic EL element further comprises a second carrier blocking layer on the first emitting layer extending on the second emitting layer configured to keep a carrier injected from the third electrode in the second emitting layer, and the third organic EL element further comprises a third carrier blocking layer on the first emitting layer extending on the third emitting layer configured to keep a carrier injected from the fifth electrode in the third emitting layer.

3. An organic EL device comprising:

a first organic EL element configured to comprise a first electrode on a substrate, a second electrode facing the first electrode, and a first emitting layer capable of emitting a first-colored light between the first and the second electrodes;

a second organic EL element configured to comprise a third electrode on the substrate, a fourth electrode facing the third electrode, and a second emitting layer capable of emitting a second-colored light having a center wavelength longer than a center wavelength of the first-colored light between the third and the fourth electrodes, wherein at least a part of the first emitting layer extends on the second emitting layer; and a third organic EL element configured to comprise a fifth electrode on the substrate, a sixth electrode facing the fifth electrode, and a third emitting layer capable of emitting a third-colored light having a center wavelength longer than the center wavelength of the second-colored light between the fifth and the sixth electrodes, wherein at least a part of the first emitting layer extends on the third emitting layer;

wherein a thickness of the first emitting layer between the first and the second electrodes is thicker than a thickness of the first emitting layer extending on the second and the third emitting layers.

4. The device of claim 3, wherein the first organic EL element further comprises a first carrier blocking layer on the first emitting layer configured to keep a carrier injected from the first electrode in the first emitting layer, the second organic EL element further comprises a second carrier blocking layer on the first emitting layer extending on the second emitting layer configured to keep a carrier injected from the third electrode in the second emitting layer, and the third organic EL element further comprises a third carrier blocking layer on the first emitting layer extending on the third emitting layer configured to keep a carrier injected from the fifth electrode in the third emitting layer.

5. The device of claim 3 further comprising first to third reflecting layers under the first, third and fifth electrodes, respectively.

6. The device of claim 5, wherein the second, fourth and sixth electrodes reflect a part of the lights emitted by the first to the third organic EL elements toward the first to third reflecting layers, respectively, a thickness from a top face of the first reflecting layer to a bottom face of the second electrode is a thickness for the first-colored light to resonate between the first reflecting layer and the second electrode, a thickness from a top face of the second reflecting layer to a bottom face of the fourth electrode is a thickness for the second-colored light to resonate between the second reflecting layer and the fourth electrode, and a thickness from a top face of the third reflecting layer to a bottom face of the sixth electrode is a thickness for the third-colored light to resonate between the third reflecting layer and the sixth electrode.

7. The device of claim 3, wherein the first emitting layer comprises:

a main emitting layer between the first and the second electrodes; and a sub emitting layer extending on the second and the third emitting layer.

8. The device of claim 3, wherein the second, fourth and sixth electrodes are connected.

9. An organic EL device comprising:

a first organic EL element configured to comprise a first electrode on a substrate, a second electrode facing the first electrode, and a first emitting layer capable of emitting a first-colored light between the first and the second electrodes;

a second organic EL element configured to comprise a third electrode on the substrate, a fourth electrode facing the third electrode, a second emitting layer capable of emitting a second-colored light having a center wavelength longer than a center wavelength of the first-colored light between the third and the fourth electrodes, and a fourth emitting layer on the second emitting layer, a material of the fourth emitting layer being identical to a material of the first emitting layer; and a third organic EL element configured to comprise a fifth electrode on the substrate, a sixth electrode facing the fifth electrode, a third emitting layer capable of emitting a third-colored light having a center wavelength longer than the center wavelength of the second-colored light between the fifth and the sixth electrodes, and a fifth emitting layer on the third emitting layer, a material of the fifth emitting layer being identical to a material of the first emitting layer;

wherein a thickness of the first emitting layer between the first and the second electrodes is thicker than a thickness of the fourth emitting layer and a thickness of the fifth emitting layer.

10. An organic EL device comprising:
a first organic EL element configured to comprise a first electrode on a substrate, a second electrode facing the first electrode, and a first emitting layer capable of emitting a first-colored light between the first and the second electrodes;
a second organic EL element configured to comprise a third electrode on the substrate, a fourth electrode facing the third electrode, and a second emitting layer capable of emitting a second-colored light having a center wavelength longer than a center wavelength of the first-colored light between the third and the fourth electrodes, wherein at least a part of the first emitting layer extends on the second emitting layer; and
a third organic EL element configured to comprise a fifth electrode on the substrate, a sixth electrode facing the fifth electrode, and a third emitting layer capable of emitting a third-colored light having a center wavelength longer than the center wavelength of the second-colored light between the fifth and the sixth electrodes, wherein at least a part of the first emitting layer extends on the third emitting layer;
wherein a thickness of the first emitting layer extending on the second emitting layer is thinner than a thickness of the first emitting layer between the first and the second electrodes and a thickness of the first emitting layer extending on the third emitting layer.

11. The device of claim 10, wherein the first organic EL element further comprises a first carrier blocking layer on the first emitting layer configured to keep a carrier injected from the first electrode in the first emitting layer,
the second organic EL element further comprises a second carrier blocking layer on the first emitting layer extending on the second emitting layer configured to keep a carrier injected from the third electrode in the second emitting layer, and
the third organic EL element further comprises a third carrier blocking layer on the first emitting layer extending on the third emitting layer configured to keep a carrier injected from the fifth electrode in the third emitting layer.

12. An organic EL device comprising:
a first organic EL element configured to comprise a first electrode on a substrate, a second electrode facing the first electrode, and a first emitting layer capable of emitting a first-colored light between the first and the second electrodes;
a second organic EL element configured to comprise a third electrode on the substrate, a fourth electrode facing the third electrode, and a second emitting layer capable of emitting a second-colored light having a center wavelength longer than a center wavelength of the first-colored light between the third and the fourth electrodes, wherein at least a part of the first emitting layer extends on the second emitting layer; and
a third organic EL element configured to comprise a fifth electrode on the substrate, a sixth electrode facing the fifth electrode, and a third emitting layer capable of emitting a third-colored light having a center wavelength longer than the center wavelength of the second-colored light between the fifth and the sixth electrodes, wherein at least a part of the first emitting layer extends on the third emitting layer;
wherein a thickness of the first emitting layer between the first and the second electrodes is thicker than a thickness of the first emitting layer extending on the second and the third emitting layers, and
a thickness from a top face of the first electrode to a bottom face of the second electrode is thicker than a thickness from a top face of the third electrode to a bottom face of the fourth electrode and a thickness from a top face of the fifth electrode to a bottom face of the sixth electrode.

13. The device of claim 12, wherein a thickness from the top face of the first electrode to a bottom face of the first emitting layer is thicker than a thickness from the top face of the third electrode to a bottom face of the second emitting layer and a thickness from the top face of the fifth electrode to a bottom face of the third emitting layer.

* * * * *